United States Patent [19]

Hishiro et al.

[11] Patent Number: 5,478,680
[45] Date of Patent: Dec. 26, 1995

[54] COLOR FILTER

[75] Inventors: Yoshiki Hishiro, Toyonaka; Naoki Takeyama, Settsu; Shigeki Yamamoto, Ibaraki, all of Japan

[73] Assignee: Sumitomo Chemical Company, Limited, Osaka, Japan

[21] Appl. No.: 263,353

[22] Filed: Jun. 21, 1994

[30] Foreign Application Priority Data

Jun. 21, 1993 [JP] Japan .................................. 5-149086
Feb. 25, 1994 [JP] Japan .................................. 6-028464

[51] Int. Cl.$^6$ .................................................... G03F 9/00
[52] U.S. Cl. ........................... 430/7; 430/281; 430/288; 430/910
[58] Field of Search .............................. 430/7, 281, 288, 430/910

[56] References Cited

U.S. PATENT DOCUMENTS 5,368,976  11/1994  Tajima et al. ................................ 430/7

FOREIGN PATENT DOCUMENTS 0362441  4/1990  European Pat. Off. ..
0483693  5/1992  European Pat. Off. ..

*Primary Examiner*—S. Rosasco
*Attorney, Agent, or Firm*—Cushman Darby & Cushman

[57]  ABSTRACT

A color filter having the thickness of 3 μm or smaller and, on a substrate, having color filter elements which have different colors each other and are made from a resist compositions comprising an alkali soluble resin and dyes having a specific color within the wave length range from 400 nm to 700 nm, wherein each of the color filter elements has the minimum light transmittance of 25% or smaller, and the color filter is excellent in various properties such as resolution, color tone, color reproductivity and color depth and it has a small thickness.

14 Claims, No Drawings

COLOR FILTER

FIELD OF THE INVENTION

This invention relates to a color filter which is used for producing a solid state camera element or a gas sensor, etc.

BACKGROUND OF THE INVENTION

Color filters have been used in CCD, LCD and the like. The color filters were usually dyed by a combination of three dyes of the three primary colors or of the three complementary colors.

Known methods for producing colored filters include dyeing methods, electrodeposition methods, printing methods, resist methods, and the like. These methods, however, suffer from a number drawbacks. Dyeing a gelatin based filter often results in uneven dyeing, swollen materials, cracking, and the like. Electrodeposition methods and printing methods require use of a thick color filter in order to obtain a sufficiently deep colored filter. Still further, a deep colored color filter cannot be obtained according to the resist methods. Thus, all of the above-mentioned methods for producing colored filters suffer from one or more problems.

SUMMARY AND OBJECTS OF THE INVENTION

The object of this invention is to solve the above-mentioned problems and to provide a color filter which is excellent in various properties such as resolution, a color tone, a color reproductivity, a color depth, etc.

The foregoing and other objects are achieved by providing a color filter having a thickness of up to 3 μm and, on a substrate, having color filter elements which have different colors from each other. The color filter elements are made from a resist composition comprising an alkyl soluble resin and dyes having a specific color within the wavelength range of 400 nm to 700 nm. Each of the color filter elements has a minimum light transmittance of up to 25%. The color filter exhibits excellent resolution, color tone, color reproductivity and color depth, while nonetheless having a small thickness.

DETAILED DESCRIPTION OF THE INVENTION

This invention is a color filter having a thickness of 3 μm or smaller and, on a substrate, having two or more kind of color filter elements which have different colors each other, wherein the color filter element is made from a resist compositions comprising an alkali soluble resin and dyes having a specific color within the wave length range from 400 nm to 700 nm and each of the color filter elements has the minimum light transmittance of up to 25. Preferably, the color filter has a thickness of 2 μm or smaller and a minimum light transmittance of up to 20%. The color filter having the thickness of 1 μm or smaller is more preferable. The light transmittance can be obtained, for example, by measuring light transmittance of each of color filter elements formed on a quartz glass by a spectrophotometer.

Though the method for producing it is not critical, the color filter of this invention is usually produced by a resist method. Preferable color filters can be produced according to the following process a)–d).

a) A resist composition comprising an alkali soluble resin, an organic solvent and a dye having a specific color within the wave length range from 400 nm to 700 nm is coated and dryed to form a coated film.

b) Specific parts of the coated film thus formed are exposed to an irradiation ray.

c) The resulting coated film is developed by an alkali developer to form a resist pattern, i.e., a color filter element.

d) a) to c) are repeated for different colors, i.e., by using a dye having a different color from the dye used in a) within the wave length range from 400 nm to 700 nm.

The resist composition useful in the above-mentioned process is prepared by filtering a composition comprising an alkali soluble resin, an organic solvent and a dye through a filter. The pore size of the filter is preferably 0.2 μ or smaller and more preferably 0.1 μ or smaller.

By preference, the color filter of this invention has color filter elements hardened by a crosslinking reaction. In order to produce this preferred color filter, a resist composition is used which further comprises a crosslinking agent having a group represented by the following formula

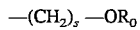

$$-(CH_2)_s-OR_0$$

wherein R0 represents a hydrogen atom or a lower alkyl group and s represents an integer from 1 to 4, in addition to the alkali soluble resin, the organic solvent and the dye.

As an example of the alkali soluble resin, a novolac resin, a polyimide precursor, a copolymer of vinylphenol such as a copolymer of styrene and maleic anhydride, a copolymer of styrene and vinylphenol, a copolymer of p-hydroxystyrene and p-acetoxymethylstyrene and the like, polyvinylphenol or the like can be mentioned. Examples of the novolac resin include a novolac resin used as an ingredient in a positive resist composition for a production of a semiconductor, such as a known novolac resin prepared by a condensation reaction between phenols and aldehydes in the presence of an acidic catalyst. Any phenols having been used for preparing a known novolac resin can be used for preparing the novolac resin in this invention. Examples of the phenols include phenol, cresol, ethylphenol, butylphenol, xylenol, phenylphenol, catechol, resorcinol, pyrogallol, naphthol, bisphenol C, bisphenol A and the like. These phenols can be used either independently or in combination of two or more. As an example of the aldehydes, an aliphatic aldehyde or an aromatic aldehyde such as formaldehyde, paraformaldehyde, acetaldehyde, propionaldehyde, benzaldehyde or the like can be mentioned. In order to modify the molecular distribution of the alkali soluble resin such as novolac resin to a preferable one, a mean such as a fractionation of the alkali soluble resin or adding a polyphenol, such as bisphenol C, bisphenol A or the like, to the alkali soluble resin may be conducted.

Examples of the organic solvent include dioxane, methylcellosolve, ethylcellosolve, methylcellosolveacetate, ethylcellosolveacetate, diethyleneglycoldimethylether, ethyleneglycolmonoisopropylether, propyleneglycolmonomethylether, N,N-dimethylformamide, N,N-dimethylacetamide, N-methylpyrrolidone, γ-butylolactone, methylethylketone, methylisobutylketone, cyclopentanone, cyclohexanone, ethyl acetate, n-butyl acetate, propyleneglycolmonomethyletheracetate, propyleneglycolmonoethyletheracetate, methyllactate, ethylpyruvate, dimethylsulfoxide, etc. These solvents can be used either independently or in combination of two or more.

Either a positive resist composition or a negative resist composition can be used for producing the color filter of this invention. The positive resist composition comprises a quinondiazide compound as a dissolution inhibitor and the negative resist composition comprises a photo-induced acid precursor and crosslinking agent in addition to the alkali soluble resin, the organic solvent and the dye.

Exposure of a coated film made from a positive resist to a ray causes a solubility difference between exposed parts and unexposed parts, because the quinondiazide compound exposed to the ray decomposes and alters a compound soluble to an alkaline developer and the quinondiazide compound unexposed acts to lower the solubility of the alkali soluble resin to the alkaline developer. Exposed parts are removed by alkaline developer and unexposed parts remain to form positive type resist patterns. The crosslinking agent acts to harden the positive resist patterns when it is heated. The photo-induced acid precursor decomposes to yield an acid when the positive resist patterns are exposed to the ray and acts to harden the patterns.

Exposure of a coated film made of a negative resist to a ray makes the alkali soluble resin hardened due to the crosslinking agent and an acid yielded from the photo-induced acid precursor by the exposure to the ray. The unexposed parts comprising unhardened resin are removed by the alkali developer and the exposed parts comprising hardened resin, which is insoluble to the alkali developer, remain to form negative tipe resist patterns.

Examples of the quinondiazide compound include o-bezoquinondiazidesulfonicacid ester, o-bebzoquinondiazidesulfonicacid amide, o-naphthoquinondiazide-4-sulfonicacid ester, o-naphthoquinondiazide-4-sulfonicacid amide, o-naphthoquinondiazide-5-sulfonicacid ester, o-naphthoquinondiazide-5-sulfonicacid amide and the like. These esters and amides are known compounds and have been used, for example, in positive resist compositions used for producing semiconductors.

Examples of the crosslinking agent having a group represented by the formula

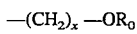

wherein $R_0$ and s are as defined above, include; a compound represented by the following formula

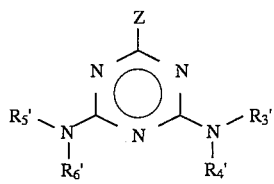

wherein Z represents $-NR_1'R_2'$ or phenyl, $R_1'$–$R_6'$ each independently represents a hydrogen atom, $-(CH_2)_sOH$ or $-(CH_2)_sOR_0$ provided that at least one of the $R_1'$–$R_6'$ is $-(CH_2)_sOH$ or $-(CH_2)_sOR_0$, $R_0$ represents a lower alkyl group and s represents an integer from 1 to 4; compounds represented by the following formulae

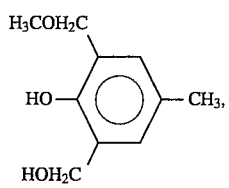

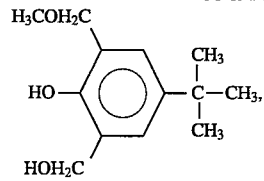

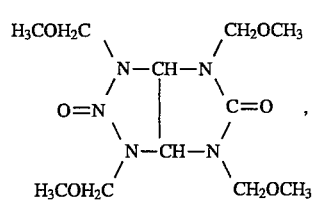

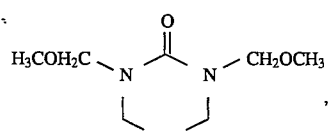

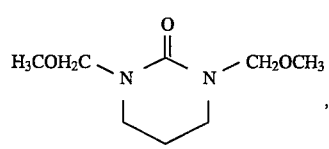

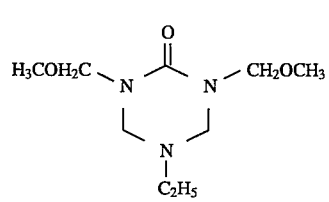

and the like. As the example of the preferable crosslinking agent, hexamethylether, hexaethylether and hexapropylether of hexamethylolmelamine can be mentioned.

Any photo-induced acid precursor can be used as long as it can yield an acid directly or indirectly by an exposure to an irradiation ray such as ultraviolet, far ultraviolet, electron beam and X ray. Examples of the photo-induced acid precursor include trihalomethyltriazine compounds mentioned in J 92-163552 A; disulfone compounds mentioned in J 89-57777 A; a compound represented by the following compound

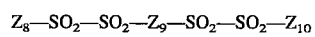

wherein Z8 and $Z_{10}$ each independently represents an aryl, aralkyl, alkyl, cycloalkyl or heterocyclic group which may be substituted and $Z_9$ represents an aryl group which may be substituted; a photo-induced acid precursor having a sulfonic acid ester group mentioned in J 89-293339 A; a compound represented by the following compound

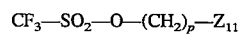

wherein $Z_{11}$ represents an aryl group which may be substituted and p represents 0 or 1; a compound represented by the following compound

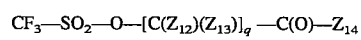

wherein $Z_{12}$ and $Z_{13}$ each independently represents an alkyl, alkoxy or aryl group which may be substituted, $Z_{14}$ represents an aryl group which may be substituted and q represent 1 or 2; a compound represented by the following compound

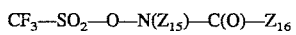

wherein $Z_{15}$ represents an alkyl group which may be substituted and $Z_{16}$ represents an aryl group which may be substituted; a compound represented by the following compound

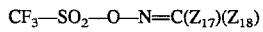

wherein $Z_{17}$ represents a hydrogen atom, an alkyl or aryl group which may be substituted and $Z_{18}$ represents an aryl group which may be substituted; and the like.

As the more concrete example of the photo-induced acid precursor, a triazine compound represented by the following formula

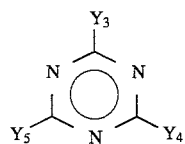

wherein $Y_3$–$Y_5$ each independently represents an alkyl, alkenyl, aryl, aralkyl or piperidino group which may be substituted, —N($Y_6$)($Y_7$), —O$Y_8$ or —S$Y_9$ provided that at least one of $Y_3$–$Y_5$ represents mono-, di- or trihalogen substituted alkyl and $Y_6$–$Y_9$ each independently represents a hydrogen atom, an alkyl or aryl group which may be substituted; an acetophenon derivatives represented by the following formula

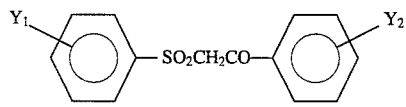

wherein $Y_1$ and $Y_2$ each independently represents a hydrogen atom or a lower alkyl group; a disulfon compound represented by the following formula

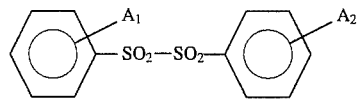

wherein $A_1$ and $A_2$ each independently represents a hydrogen atom, a halogen atom, a lower alkyl group or a lower alkoxy group; sulfonic acid derivatives represented by the following formulae

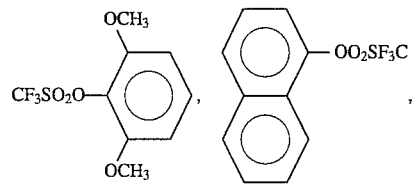

-continued

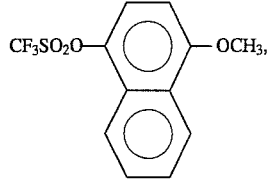

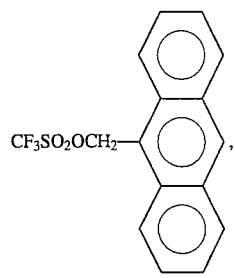

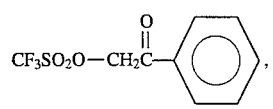

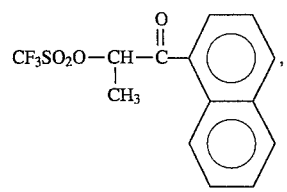

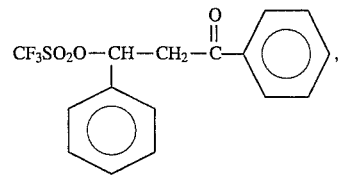

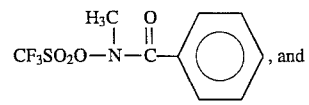

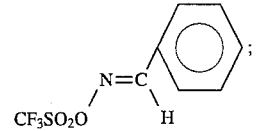

onium salts represented by the following formulae

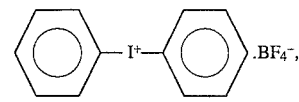

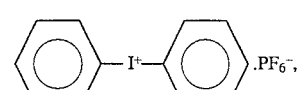

-continued

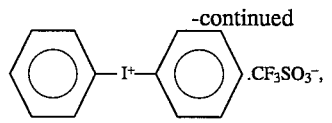

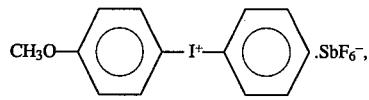

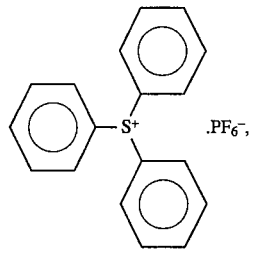

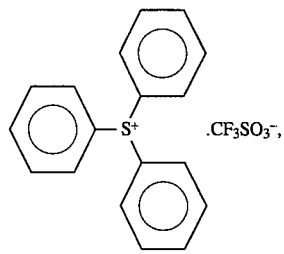

and the like can be mentioned.

As the dye having a specific color in the wave length range from 400 nm to 700 nm, a dye having one of the three primary colors or one of the three complementary colors and being soluble to an organic solvent as well as an alkali developer can be preferably mentioned. Preferable examples of the dye include dyes having a color of cyan, magenta, yellow, red, blue or green and also having a sulfonamide group substituted by one substituent. As examples of the dyes, cumalin, styryl, azo, anthraquinone, xanthenium and phthalocyanine dyes and the like can be mentioned.

As a preferable example of the yellow dye, a dye represented by the following formula (I)

$$B-A-M \qquad (I)$$

wherein M represents a group represented by the following formula

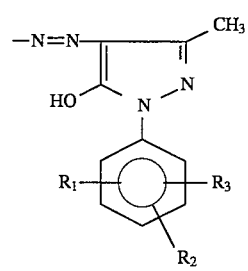

wherein $R_1$–$R_3$ each independently represents a hydrogen atom, a halogen atom, —$SO_3M'$ or —$SO_2$—NH—R provided that at least one of $R_1$–$R_3$ is —$SO_2$—NH—R, M' represents an alkali metal atom, a quarternary alkyl ammonium salt or preferably a hydrogen atom and R represents an alkyl cyclohexylalkyl, alkylcarbonylaminoalkyl, alkoxy, alkoxyalkyl, aryl, aralkyl or cyclohexylalkyl group, which may be substituted; A represents a crosslinking group represented by one of the following formulae

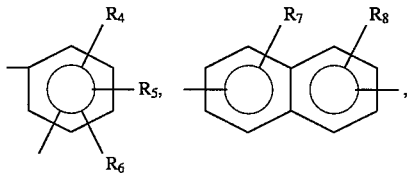

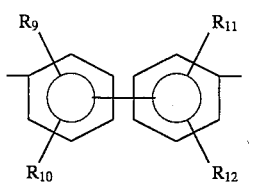

and

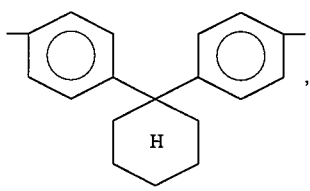

wherein $R_4$–$R_{12}$ each independently represents a hydrogen atom, a halogen atom, a methyl group, —$SO_3M'$ or —$SO_2$—NH—R (M' is as defined above); and B is M or a group represented by one of the following formulae

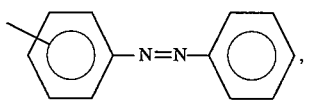

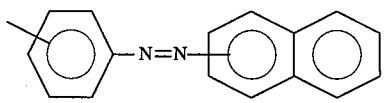

and

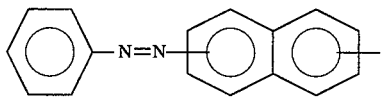

can be mentioned.

As a preferable example of the magenta dye, a dye represented by the following formula (II)

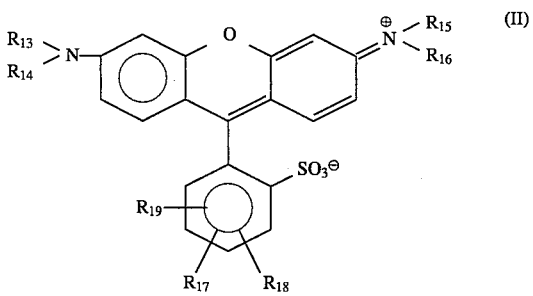

wherein $R_{13}$–$R_{16}$ each independently represents a hydrogen atom, an alkyl or aryl group which may be substituted, $R_{17}$–$R_{19}$ each independently represents a hydrogen atom, an alkyl group, an aryl group, —SO₃M' or —SO₂—NH—R provided that at least one of $R_{17}$–$R_{19}$ is —SO₂—NH—R and M' and R are as defined above, can be mentioned.

As a preferable example of the cyan dye, a dye represented by the following formula (III)

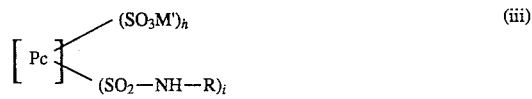

wherein Pc represents a phthalocyanine nuclear, h and i each independently represents a mean substitution number of —SO₃M' and —SO₂—NH—R respectively, M' and R are as defined above provided that $h+i \leq 4$, $h \leq 3$ and $1 \leq i \leq 4$, can be mentioned.

Examples of the dye represented by the formula (I) include a dye represented by one of the following formulae:

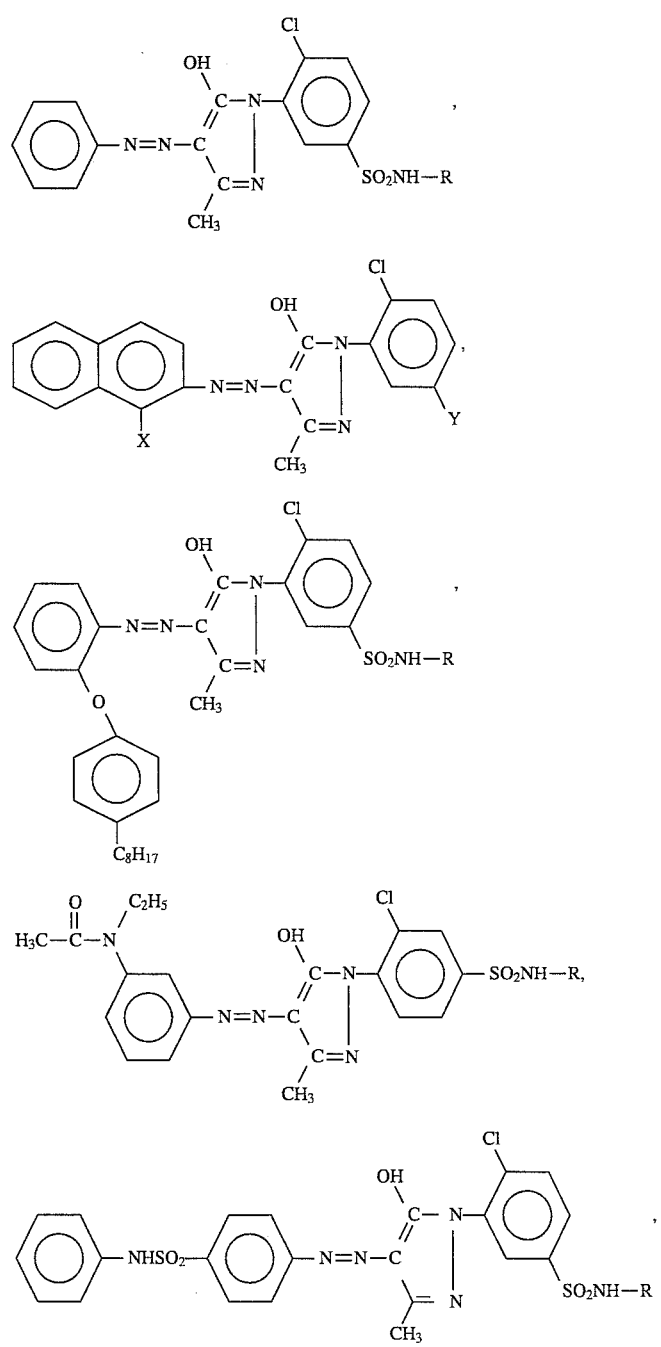

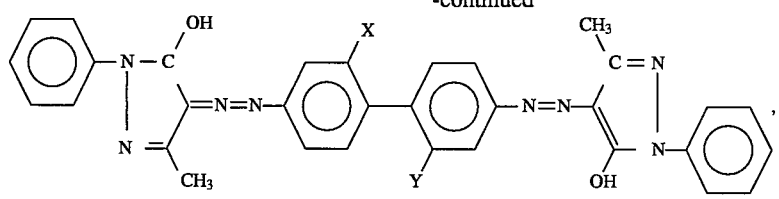
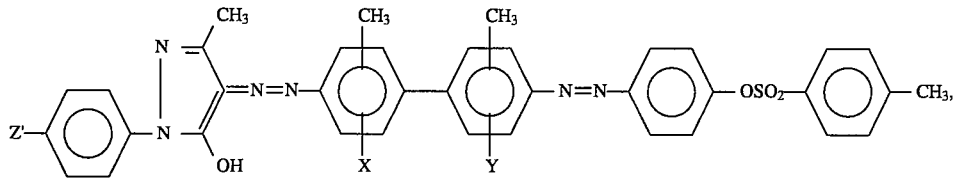
and
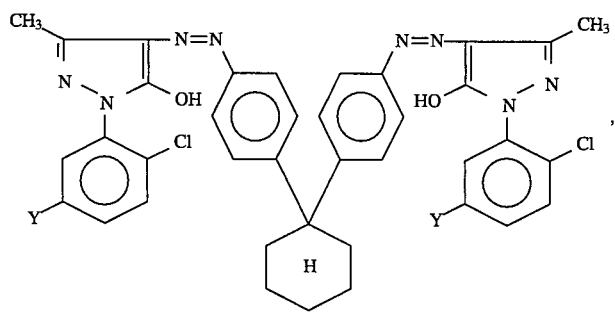
wherein X, Y and Z' each independently represents —SO₃M' or —SO₂—NH—R provided that at least one of X, Y and Z' is —SO₂—NH—R and M' and R are as defined above, and the like.
Examples of the dye represented by the formula (II) include a dye represented by one of the following formulae:
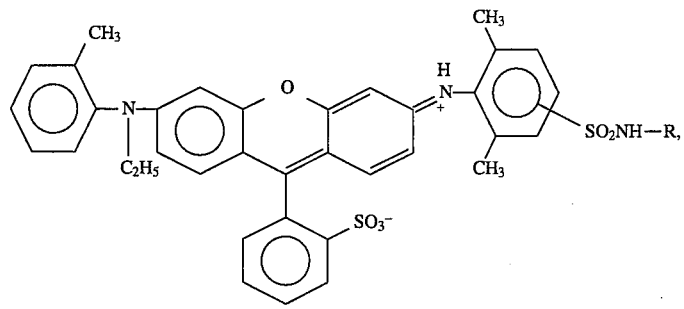
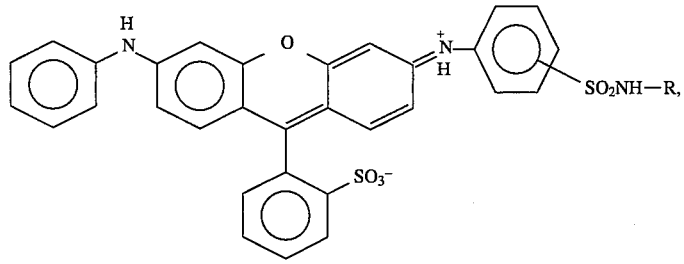

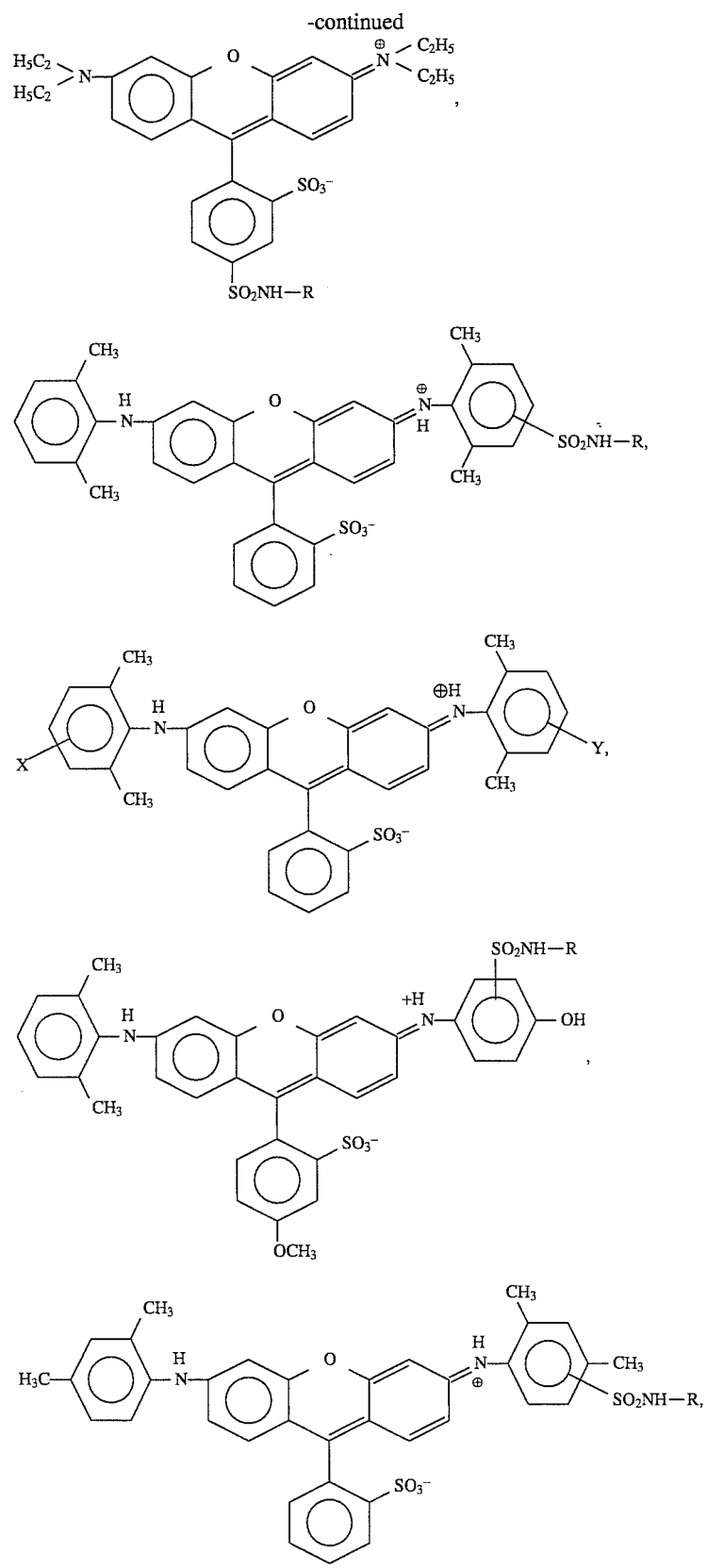

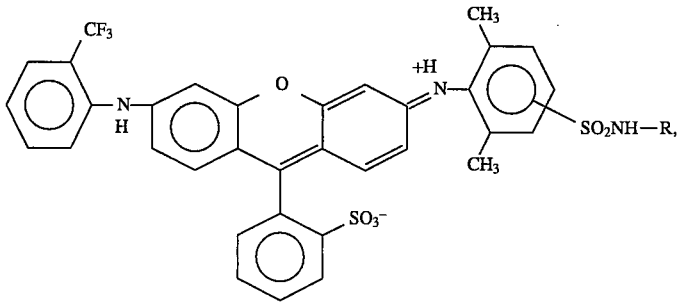

and

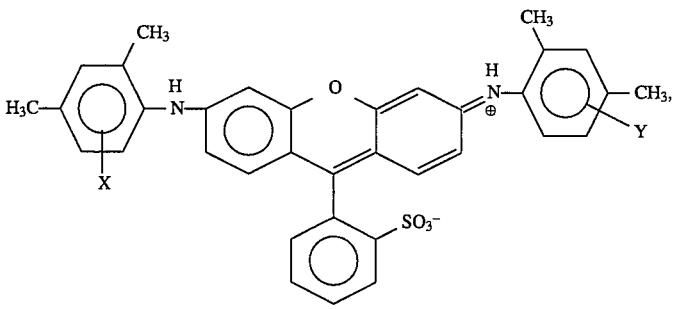

wherein X, Y and Z' each independently represents —SO$_3$M' or —SO$_2$—NH—R provided that at least one of X, Y and Z' is —SO$_2$—NH—R and M' and R are as defined above, and the like.

The dye used in this invention can be obtained, for example, by chlorinating a dye having sulfonic acid group according to a usual manner to obtain a sulfochloride and reacting the sulfochloride thus obtained with a primary amine. The dye used in this invention can also be obtained by chlorinating a precursor of the dye to obtain a sulfochloride, reacting the sulfochloride thus obtained with a primary amine and then altering the resulting compound to the aimed dye. Examples of the dye having a sulfonicacid group include dyes selected from C.I. Acid Color or Direct Color in Color Index, etc.

The amount of the dye in the positive resist composition is usually from 1 to 300 parts by weight, preferably 100 to 300 parts by weight, based on 100 parts of the quinondiazide compound.

When the alkali soluble resin contains a novolac resin, preferable amount of the alkali soluble resin is 1.5 parts by weight or less based on 1 part by weight of the dye. The preferable amounts of the crosslinking agent and the photo-induced acid precursor vary according to the situation where they are used.

The color filter of this invention is excellent in various properties such as resolution, color tone, color reproductivity and color depth and it has a small thickness.

Next, this invention will be explained in more detail with reference to the following examples. In the examples, "parts" represents "parts by weight" unless otherwise referred to.

Referential example 1

A mixture of 20 g of an acidic dye represented by the following formula

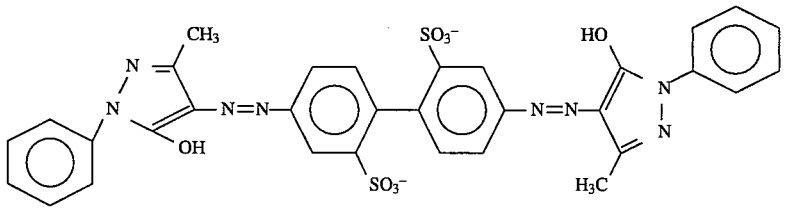

(Suminol Milling Yellow MR, manufactured by Sumitomo Chemical Co., Ltd.), 100 ml of thionyl chloride and 15 g of dimethylformamide was allowed to react for 30 minutes under refluxing and the resulting mixture was poured into iced water, then extracted with organic solvent, washed with water, dried and concentrated to obtain the sulfonylchloride compound. The sulfonylchloride compound thus obtained was reacted with 3-(2-ethylhexyloxy)propylamine with the molar ratio of 1:2 in tetrahydrofuran to obtain the sulfonamide compound.

Referential example 2

According to the same manner as in Referential example 1 except that a dye represented by the following formula

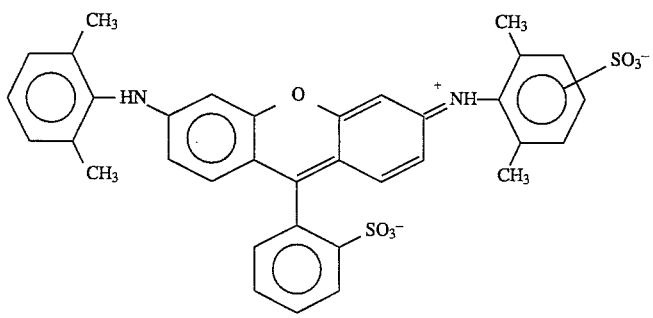

was used, the sulfonylchloride compound was obtained. The sulfonylchloride compound thus obtained was reacted with 3-(2-ethylhexyloxy)propylamine with the molar ratio of 1:1 in tetrahydrofuran to obtain the sulfonamide compound.

Referential example 3

0.2 Part of hexaethoxymethylolmelamine, 1 part of cresol novolac resin produced by reacting m-cresol, p-cresol and formalin with the molar ratio of 5:5:7.5, 0.7 part of o-naphthoquinondiazide-5-sulfonicacidester (wherein two hydroxy groups were esterified in average) of a phenol compound represented by the following formula,

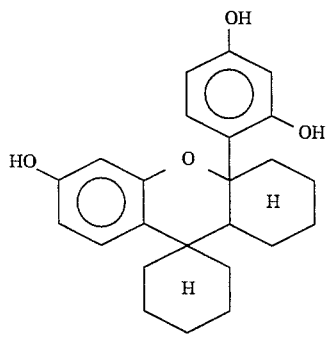

1.0 part of the sulfonamide compound obtained in Referential example 1, 3 parts of dimethylformamide and 6 parts of ethyllactate were mixed and the resulting mixture was filtered under an elevated pressure through a membrane filter having a pore size of 0.2 μ to prepare a positive resist composition.

Referential example 4

Referential example 3 was repeated except that the sulfonamide compound obtained in Referential example 2 was used instead of the sulfonamide compound used in Referential example 3 to prepare a positive resist composition.

Referential example 5

Referential example 3 was repeated except that Oleosol fast blue RL (a sulfonamide compound having copper-phthalocyanine nuclear, manufactured by Taoka Chemical Co.) was used instead of the sulfonamide compound used in Referential example 3 to prepare a positive resist composition.

In the following examples, experiments were conducted according to the following condition unless otherwise referred to.

As the substrate, CCD coated with acrylic resin was used. A resist composition comprising a dye, an alkali soluble resin, an organic solvent, etc. was coated on the substrate by mean of a spinner to form a resist film and the film was heated to remove the solvent. Then the resist film was exposed to a ray through a patterned mask. When a negative resist was used, if necessary, the exposed resist film was heated at 180° C. for 20 minutes. Then the resist film was developed to obtain band type pattern or mosaic pattern. When a positive resist was used, the pattern thus obtained was exposed to a ray and heated at 180° C. for 20 minutes to prepare a color filter.

The exposure to a ray was conducted with HITACHI LD-5010-i (NA=0.40, an I-line Stepper manufactured by Hitachi Ltd.) or NIKON NSR (NA=0.50, an I-line Stepper manufactured by Nikon Corp.). As the developer, SOPD (manufactured by Sumitomo Chemical Co.) or 3% aqueous solution of tetramethylammonium hydroxide was used.

EXAMPLE 1

Using each of the resist composition prepared in Referential example 3, 4 and 5 successively, above-mentioned process was conducted three times to obtain a color filter. The color filter thus obtained is excellent in various properties such as resolution, color tone, color reproductivity and color depth and has the thickness of not more than 1 μ. In each of the wave length ranges of the three dyes, the minimum light transmittance was not more than 25%.

Referential example 6

Referential example 3 was repeated except that the sulfonamide compound represented by the following formula

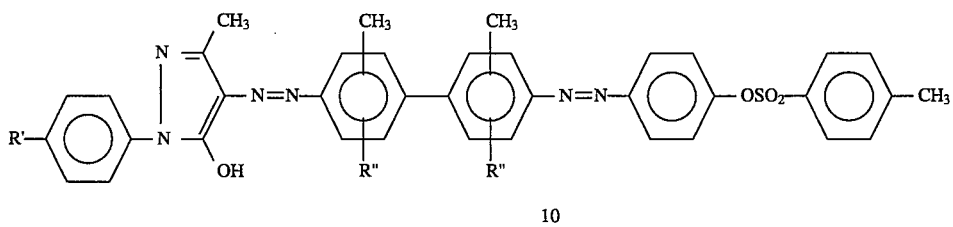

wherein R' is —SO$_2$NH(CH$_2$)$_3$O(CH$_2$)$_7$CH$_3$ and R" is H or R', was used instead of the sulfonamide compound used in Referential example 3 to prepare a positive resist composition.

Referential example 7

Referential example 3 was repeated except that the sulfonamide compound represented by the following formula

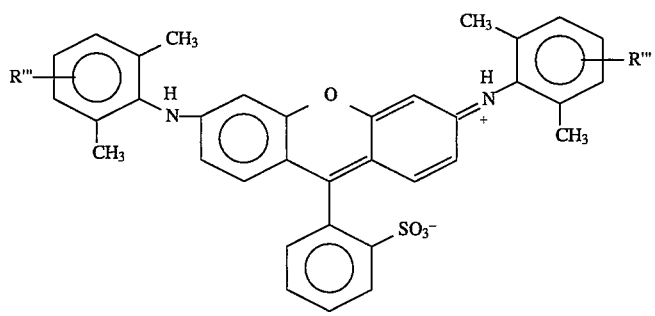

wherein R'" is —SO$_2$NH(CH$_2$)$_3$O(CH$_2$)$_7$CH$_3$, was used instead of the sulfonamide compound used in Referential example 3 to prepare a positive resist composition.

EXAMPLE 2

Example 1 was repeated except that the resist composition prepared in Referential example 6, 7 and 5 were used successively to obtain a color filter. The color filter thus obtained is excellent in various properties such as resolution, color tone, color reproductivity and color depth and has the thickness of not more than 1 μ. In each of the wavelength ranges of the three dyes, the minimum light transmittance was not more than 25%.

Referential example 8

Referential example 1 was repeated except that 1,5-dimethyl-heptylamine was used instead of 3-(2-ethylhexyloxy)propylamine to obtain a sulfonamide compound.

Referential example 9

0.3 Part of hexaethoxymethylolmelamine, 1 part of cresol novolac resin produced by reacting m-cresol, p-cresol and formalin with the molar ratio of 5:5:7.5, 0.7 part of o-naphthoquinondiazide-5-sulfonicacidester (wherein two hydroxy groups were esterified in average) of a phenol compound represented by the following formula,

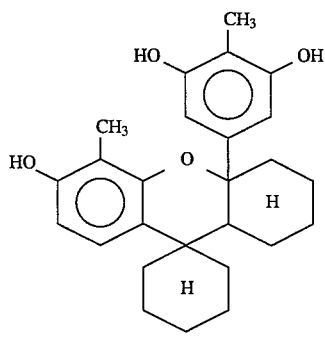

0.7 part of the sulfonamide compound obtained in Referential example 8 and 9.5 parts of ethyllactate were mixed and filtered under an elevated pressure through a membrane filter having a pore size of 0.2 μ to prepare a positive resist composition.

Referential example 10

Referential example 9 was repeated except that a mixture of 0.3 part of a novolac resin produced by reacting a compound represented by the following formula

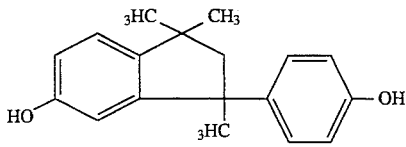

and formalin with the molar ratio of 0.95:1 and 0.7 part of MARUCALINCUR-CST-70 (stylene-vinylphenol copolymer, manufactured by Maruzen Oil Co. Ltd.) instead of 1 part of the cresol novolac resin used in Referential Example 3 to prepare a positive resist composition.

EXAMPLE 3

Example 1 was repeated except that the resist composition prepared in Referential example 9, 4 and 5 were used successively to obtain a color filter. The color filter thus obtained is excellent in various properties such as resolution, color tone, color reproductivity and color depth and has the thickness of not more than 1 μ. In each of the wavelength ranges of the three dyes, the minimum light transmittance was not more than 25%.

EXAMPLE 4

Example 1 was repeated except that the resist composition prepared in Referential example 10, 4 and 5 were used successively to obtain a color filter. The color filter thus obtained is excellent in various properties such as resolution, color tone, color reproductivity and color depth and has the thickness of not more than 1 μ. In each of the wave length ranges of the three dyes, the minimum light transmittance was not more than 25%.

Referential example 11

Referential example 10 was repeated except that 0.2 part of a photo-induced acid precursor represented by the following formula

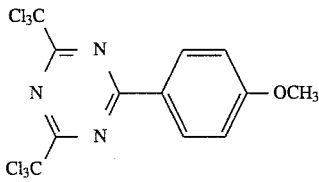

was used instead of 0.7 part of o-naphthoquinondiazide-5-sulfonicacidester and a mixed solvent of 3.5 parts of N,N-dimethylformamide and 6 parts of ethyllactate was used instead of 9.5 parts ethyllactate to prepare a negative resist composition.

Referential example 12

Referential example 11 was repeated except that Oleosol fast blue RL (a sulfonamide compound having copper-phthalocyanine nuclear, manufactured by Taoka Chemical Co.) was used instead of the sulfonamide compound obtained in Referential example 6 to prepare a negative resist composition.

Referential example 13

Referential example 11 was repeated except that the sulfonamide compound obtained in Referential example 2 was used instead of the sulfonamide compound obtained in Referential example 6 to prepare a negative resist composition.

EXAMPLE 5

Example 1 was repeated except that the resist composition prepared in Referential example 11, 12 and 13 were used successively to obtain a color filter. The color filter thus obtained is excellent in various properties such as resolution, color tone, color reproductivity and color depth and has the thickness of not more than 1 μ. In each of the wave length ranges of the three dyes, the minimum light transmittance was not more than 25%.

What we claim are:

1. A color filter having a thickness of up to 3 μm and, on a substrate, having two or more color filter elements which have different colors from each other, and wherein the color filter is made from a resist composition comprising an alkali soluble resin, dyes having at least one —$SO_2$—NH—R group and a smaller polarity than the alkali-soluble resin and said dyes having a specific color within the wave length range from 400 nm to 700 nm, and a crosslinking agent having a group represented by the following formula:

$$-(CH_2)_s-OR_0$$

wherein said formula $R_0$ represents a hydrogen atom or a lower alkyl group and s represents an integer from 1 to 4, and each of the color filter elements has a minimum light transmittance of up to 25%.

2. The color filter according to claim 1, wherein the thickness of the color filter is up to 2 μm and the minimum light transmittance is up to 20%.

3. The color filter according to claim 1 which is produced by:

a) coating substrate with a resist composition comprising an alkali soluble resin, an organic solvent and a dye having a specific color within the wave length range from 400 nm to 700 nm and drying the coating to form a coated film, (b) exposing specific parts of the coated film thus formed to an irradiation ray, (c) developing the resulting coated film with an alkali developer to form a color filter element, and (d) repeating steps a) to c) using a dye having a different color from the dye used in a) within the wave length range from 400 nm to 700 nm.

4. The color filter according to claim 3, wherein the resist composition is a positive resist composition which further comprises a quinondizaide compound.

5. The color filter according to claim 4, wherein the positive resist composition further comprises a crosslinking agent.

6. The color filter according to claim 5, wherein the positive resist composition further comprises a photo-induced acid precursor.

7. The color filter according to claim 5, wherein the weight ratio of the dye to the quinodiazide compound is at least 1:1.

8. The color filter according to claim 7, wherein the alkali soluble resin in the resist composition contains a novolac resin and the weight ratio of the alkali soluble resin to the dye is up to 1.5:1.

9. The color filter according to claim 4, wherein said quinondiazide compound is selected from the group consisting of o-bebezoquinondiazide sulfonic acid ester, o-bebezoquinondiazide sulfonic acid amide, o-naphthoquinondiazide- 4-sulfonic acid ester, o-naphthoquinondiazide-4-sulfonic-acid amide, o-napthoquinondiazide-sulfonic acid ester, and o-napthoquinondiazide- 5-sulfonic acid amide.

10. The color filter according to claim 3, wherein the resist composition is a negative resist composition which further comprises a crosslinking agent and a photo-induced acid precursor.

11. A color filter according to claim 1, wherein the dyes having a specific color within the wave length range from 400 nm to 700 nm are:

(a) a dye represented by the following formula (I)

  B—A—M        (I)

wherein M represents a group represented by the following formula

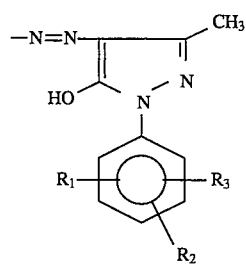

wherein $R_1$–$R_3$ each independently represents a hydrogen atom, a halogen atom, —$SO_3M'$ or —$SO_2$—NH—R provided that at least one of $R_1$–$R_3$ is $SO_2$—NHR, M' represents an alkali metal atom, a quaternary alkyl ammonium salt or a hydrogen atom and R represents an alkyl, cyclohexylalkyl, alkylcarbonylaminoalkyl, alkoxy, alkoxyalkyl, aryl, aralkyl or cyclohexylalkyl group which may be substituted, A represents a crosslinking group represented by one of the following formulae

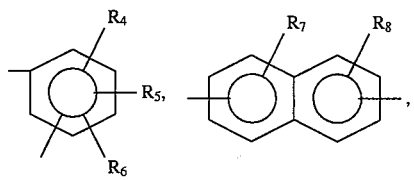

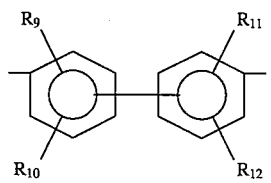

and

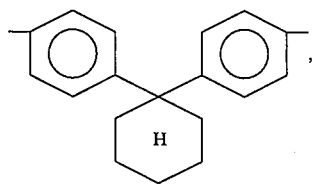

wherein $R_4$–$R_{12}$ each independently represents a hydrogen atom, a halogen atom, a methyl group, —$SO_3M'$ or —$SO_2$—NH—R, M' is as defined above, and B is M or a group represented by one of the following formulae

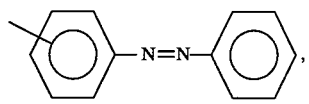

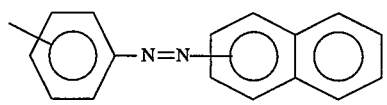

and

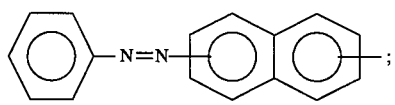

(b) dye represented by the following formula

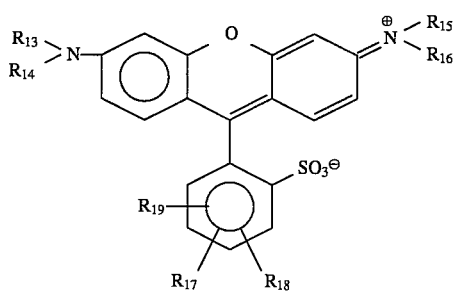

wherein $R_{13}$–$R_{16}$ each independently represents a hydrogen atom, an alkyl or aryl group which may be substituted, $R_{17}$–$R_{19}$ each independently represents a hydrogen atom, an alkyl group, an aryl group, —$SO_3M'$ or —$SO_2$—NH—R provided that at least one of $R_{17}$–$R_{19}$ is —$SO_2$—NH—R and M' and R are as defined above; and (c) a dye represented by the following formula

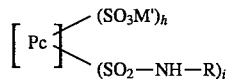

wherein Pc represents a phthalocyanine nucleus, h and i each independently represents a mean substitution number of —$SO_3M'$ and —$SO_2$—NH—R respectively, M' and R are as defined above provided that h+i≦4, h≦3 and 1≦i≦4.

12. A color filter having a thickness of up to 3 µm comprising a substrate and at least two color filter elements which have different colors from each other formed on said substrate, and wherein a color filter element is made from a resist composition comprised of an alkyl soluble resin, dyes having a specific color within the wave length range of from 400 nm to 700 nm, said dyes selected from the group consisting of:

a dye represented by the following formula (I)

 B—A—M        (I)

wherein M represents a group represented by the following formula

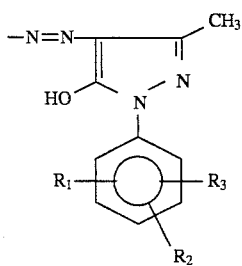

wherein $R_1$–$R_3$ each independently represents a hydrogen atom, a halogen atom, $-SO_3M^1$ or $-SO_2-NH-R$ provided that at least one of $R_1$–$R_3$ is $SO_2-NHR$, M' represents an alkali metal atom, a quaternary alkyl ammonium salt or a hydrogen atom and R represents an alkyl, cyclohexylalkyl, alkylcarbonylaminoalkyl, alkoxy, alkoxyalkyl, aryl, aralkyl or cyclohexylalkyl group which may be substituted, A represents a crosslinking group represented by one of the following formulae

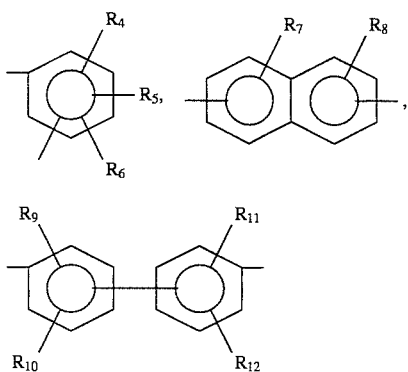

and

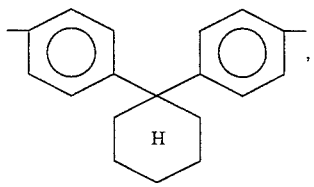

wherein $R_4$–$R_{12}$ each independently represents a hydrogen atom, a halogen atom, a methyl group, $-SO_3M'$ or $-SO_2-NH-R$, M' is as defined above, and B is M or a group represented by one of the following formulae

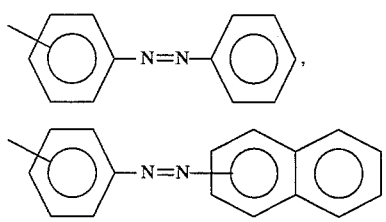

and

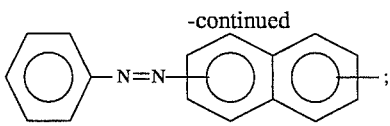

a dye represented by the following formula

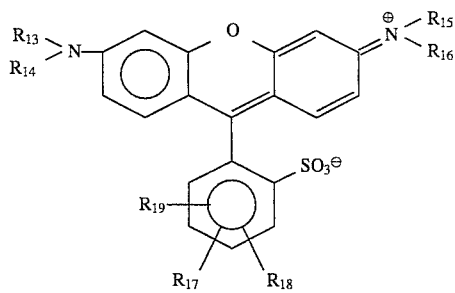

wherein $R_{13}$–$R_{16}$ each independently represents a hydrogen atom, an alkyl or aryl group which may be substituted, $R_{17}$–$R_{19}$ each independently represents a hydrogen atom, an alkyl group, an aryl group, $-SO_3M'$ or $-SO_2-NH-R$ provided that at least one of $R_{17}$–$R_{19}$ is $-SO_2-NH-R$ and M' and R are as defined above; and a dye represented by the following formula

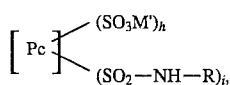

wherein Pc represents a phthalocyanine nucleus, h and i each independently represents a mean substitution number of $-SO_3M'$ and $-SO_2-NH-R$ respectively, M' and R are as defined above provided that h+ i≦4, h≦3 and 1≦i≦4, and a crosslinking agent which is at least one member selected from the group consisting of:

compounds represented by the formula:

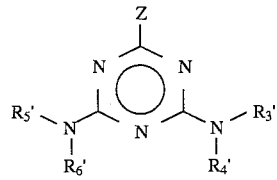

wherein Z represents $-NH_1'R_2'$ or phenyl, $R_1$,–$R_6$ each independently represents a hydrogen atom, $-(CH_2)_sOH$ or $-(CH_2)_sOR_o$, and at least one of $R_1'$–$R_6'$ is $-(CH_2)_sOH$ or $-(CH_2)_sOR_o$, $R_o$ represents a lower alkyl group, and s represents an integer from 1 to 4, and compounds represented by the following formulae

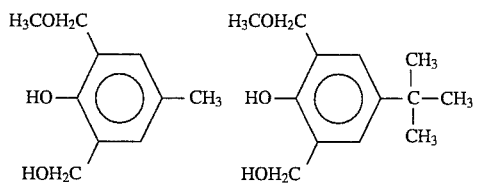

-continued
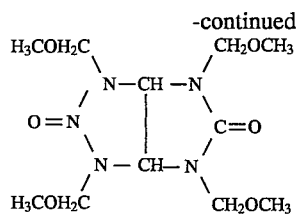
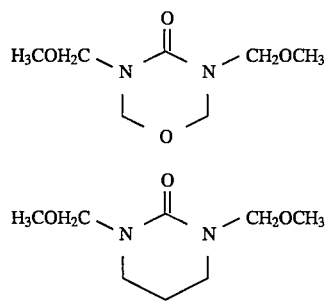
and
-continued
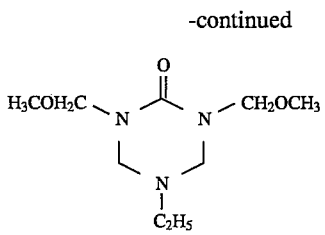
wherein each of the color filter elements has a minimum light transmittance of up to 25%.
13. The color filter according to claim 12, wherein the dye represented by the formula (I) is at least one of the following:
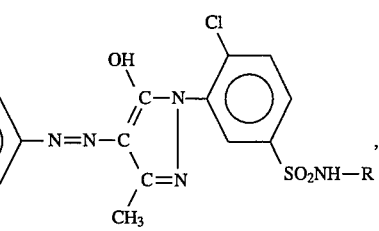
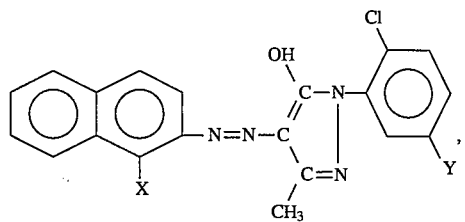
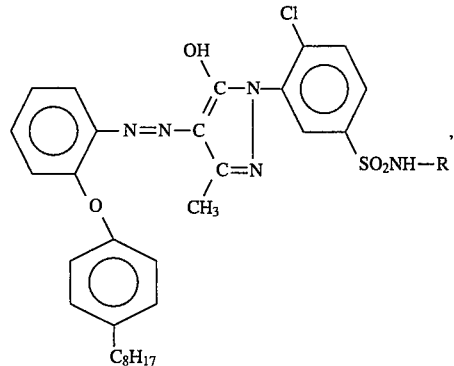
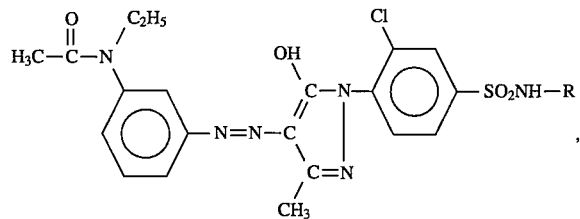

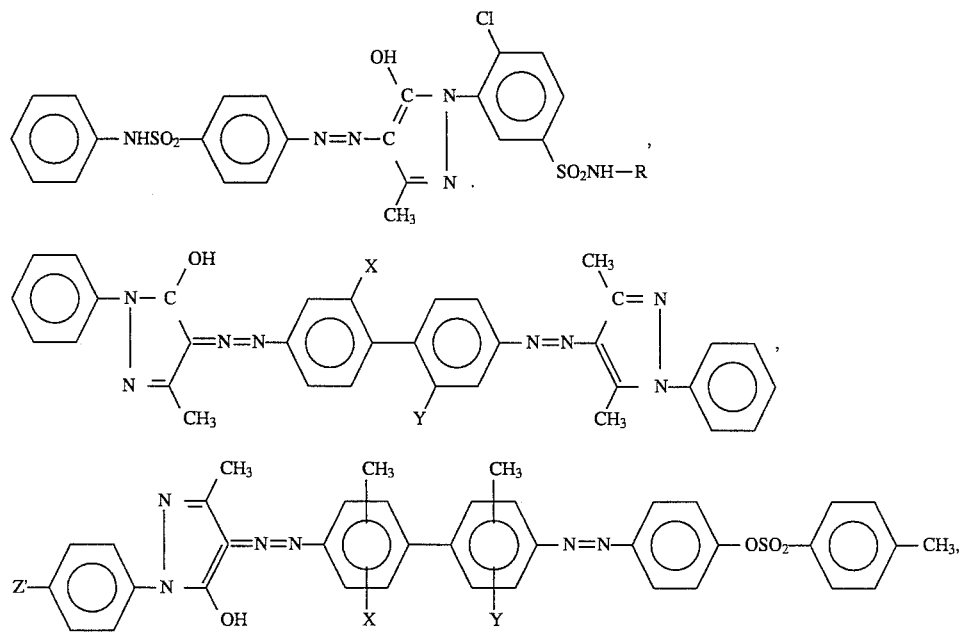
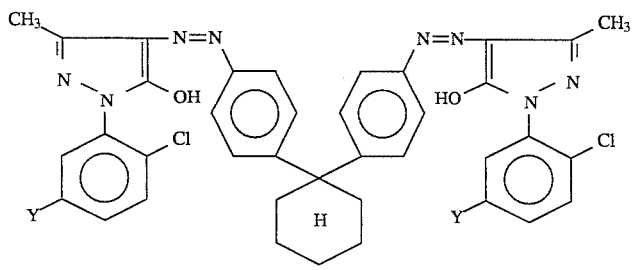
and
wherein X, Y and Z' each independently represents —SO$_3$M' or —SO$_2$—NH—R provided that at least one X, Y and Z' is —SO$_2$—NH—RM', and R is as defined above:
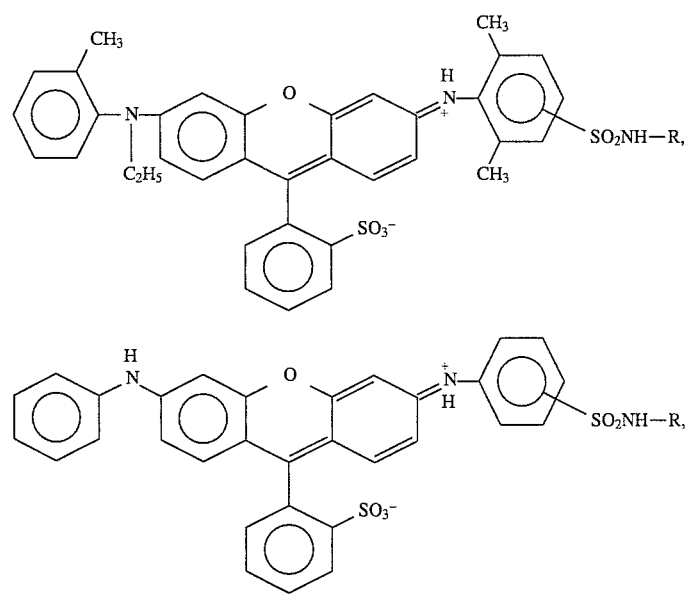

-continued
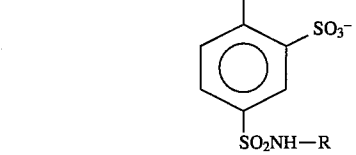
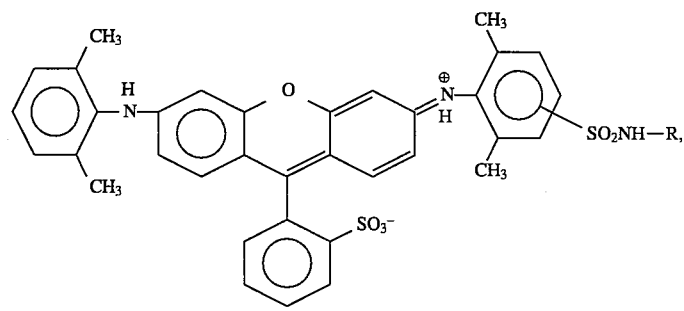
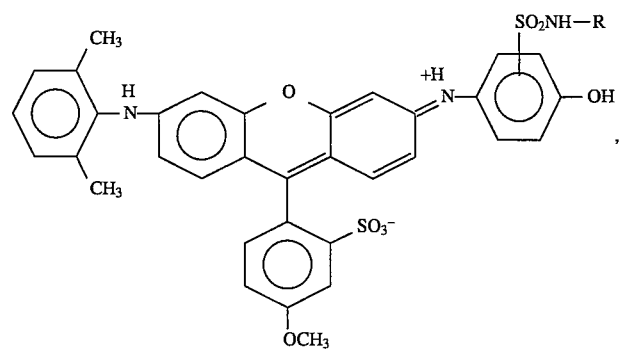
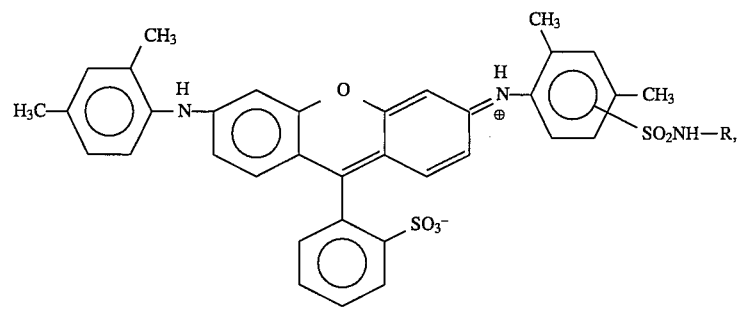
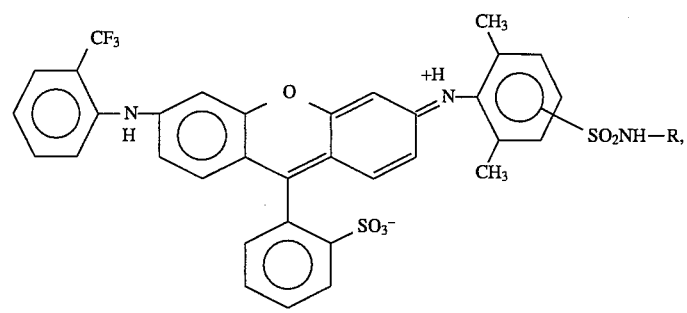

-continued
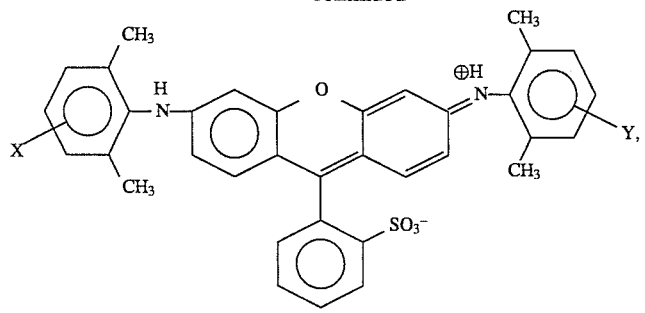
and
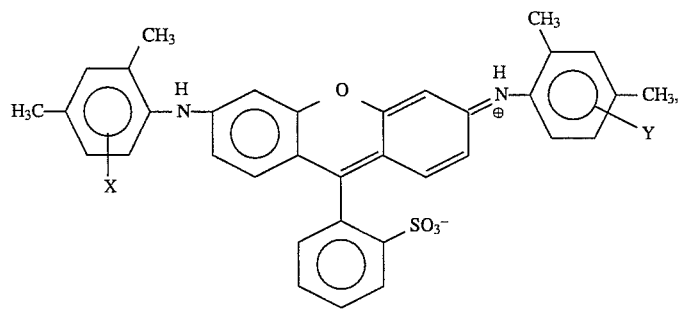
wherein X, Y and Z' each independently represents —SO₃M' or —SO₂—NH—R provided that at least one of X, Y and Z' is —SO₂—NH—RM' and R as defined above.
14. The color filter according to claim 12, wherein said crosslinking agent is the hexamethylether, hexaethylether, or hexpropylether of hexmethylolmelamine.
* * * * *